United States Patent
Walker et al.

(10) Patent No.: US 6,825,560 B1
(45) Date of Patent: Nov. 30, 2004

(54) SOLDER FILLER

(75) Inventors: Jeffrey Scott Walker, High Point, NC (US); Joseph Byron Bullis, Graham, NC (US)

(73) Assignee: RF Micro Devices, Inc., Greensboro, NC (US)

(*) Notice: Subject to any disclaimer, the term of this patent is extended or adjusted under 35 U.S.C. 154(b) by 0 days.

(21) Appl. No.: 10/443,277

(22) Filed: May 22, 2003

(51) Int. Cl.[7] .............................................. H01L 29/40

(52) U.S. Cl. ....................... 257/746; 257/737; 257/778

(58) Field of Search .............................. 257/678, 778, 257/737, 738, 746

(56) References Cited

U.S. PATENT DOCUMENTS 6,365,973 B1 * 4/2002 Koning ...................... 257/772
6,518,677 B1 * 2/2003 Capote et al. ............... 257/783

* cited by examiner

Primary Examiner—Roy Potter
(74) Attorney, Agent, or Firm—Withrow & Terranova, PLLC

(57) ABSTRACT

The present invention relates to electrically attaching a surface mount device to mounting structure via their respective contact pads using an attach material, such as solder or conductive epoxy, which includes a filler material. In general, the filler material is relatively solid and granular shaped, wherein the diameter of the filler material controls a mounting distance between the surface mount device and the mounting structure. The filler allows a desired distance to be maintained during initial placement of the surface mount device and any subsequent reheating.

30 Claims, 3 Drawing Sheets

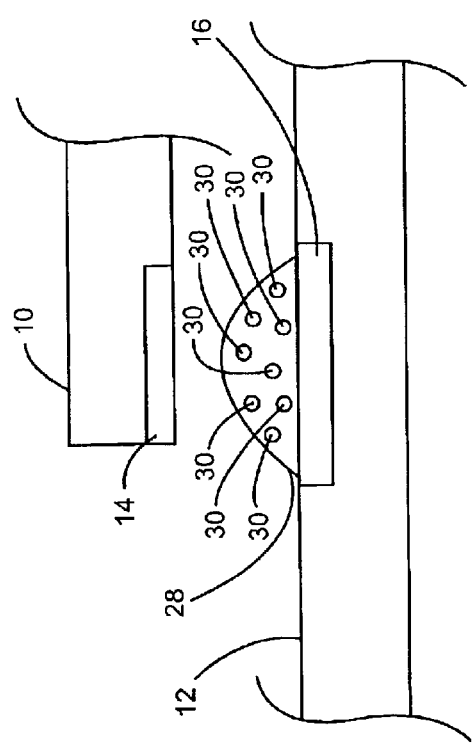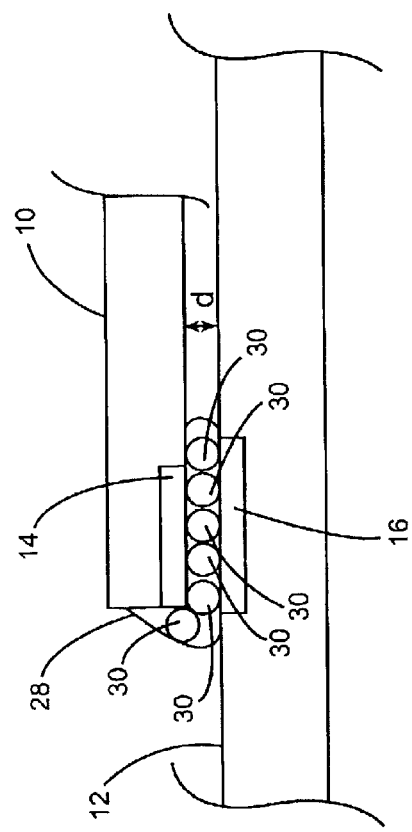

SOLDER FILLER

FIELD OF THE INVENTION

The present invention relates to mounting electronic surface mount devices to a mounting structure, and more specifically relates to a solder or conductive epoxy including filler to be used to mount surface mount devices to a mounting structure.

BACKGROUND OF THE INVENTION

Typically, the process of mounting a surface mount device to a mounting structure includes placing a conductive attach material such as solder or conductive epoxy on electronic contact pads of the structure, aligning electronic contact pads of the surface mount device with the contact pads of the structure, and placing the contact pads of the surface mount device onto the attach material. Due to the placement of the surface mount device and the force of gravity, the distance between the surface mount device and the structure is difficult to control. Often, the contact pads of the surface mount device come to rest on the contact pads of the structure, which may force the attach material to disperse and possibly short the contact pads of the surface mount device. Further, any subsequent heating of the surface mount device may allow reflow of the attach material, which may also short the contact pads of the surface mount device. In addition, the unpredictable distance between the surface mount device and the mounting structure is undesirable in some radio frequency applications, as the distance may affect circuit performance.

FIG. 1 illustrates a surface mount device 10 mounted to a mounting structure 12 as commonly known in the art. Electrical contact pads 14 and 16 of the surface mount device 10 and the mounting structure 12, respectively, are connected by attach material 18. By electrically attaching the contact pads 14 of the surface mount device 10 to the contact pads 16 of the mounting structure 12, the surface mount device 10 is effectively mounted to the mounting structure 12. For exemplary purposes, the attach material 18 is solder. The solder 18 is heated such that it is in a molten state when mounting the surface mount device 10 to the mounting structure 12. The contact pads 14 of the surface mount device 10 are then aligned with the contact pads 16 of the mounting structure 12, and the surface mount device 10 is placed on the solder 18, thereby mounting the surface mount device 10 to the mounting structure 12.

Due to the molten state of the solder 18 and the placing of the surface mount device 10, a distance d between the surface mount device 10 and the mounting structure 12 is very difficult to control. In some cases, the distance d becomes extremely small and may approach zero. Therefore, the solder 18 may be compressed such that the contact pads 14 of the surface mount device 10 are shorted.

Once the surface mount device 10 is mounted to the mounting structure 12, the mounting structure 12 may be mounted to a second mounting structure 20. Contact pads 22 and 24 of the mounting structure 12 and the second mounting structure 20, respectively, are aligned and electrically connected by attach material 26. In order to mount the mounting structure 12 to the second mounting structure 20, the attach material 26 is heated. In the case that the attach material 26 is solder, the attach material 26 is heated into its molten state during attachment. If the attach material 26 is conductive epoxy, the attach material 26 is heated in order to cure the attach material 26. In either case, the heating of the attach material 26 may reheat the solder 18 connecting the surface mount device 10 to the mounting structure 12. When reheated, the solder 18 may reflow and short the contact pads 14 of the surface mount device or other conductive areas Similarly to the distance d, a second distance (not shown) between the mounting structure 12 and the second mounting structure 20 is difficult to control. Therefore, the placement of the mounting structure 12 onto the second mounting structure 20 or the force of gravity may cause the attach material 26 to short the contact pads of the mounting structure 12.

The above discussion focuses on using solder as the attach material 18; however, problems similar to those associated with solder exist for other attach materials such as conductive epoxy. Thus, there remains a need for a cost-effective method for controlling the distance d between a surface mount device 10 and a mounting structure 12 and/or between two mounting structures 12 and 20.

SUMMARY OF THE INVENTION

The present invention relates to electrically attaching a surface mount device to a mounting structure via their respective contact pads using an attach material, such as solder or conductive epoxy, which includes a filler material. In general, the filler material is relatively solid and granular shaped, wherein the diameter of the filler material controls a mounting distance between the surface mount device and the mounting structure. The filler allows the desired distance to be maintained during initial placement of the device and any subsequent reheating. The process of mounting the surface mount device to the mounting structure is achieved by placing the attach material including the filler material on the contact pads of the surface mount device and/or the contact pads of the mounting structure. The contact pads of the surface mount device are aligned with the contact pads of the mounting structure, and the surface mount device is placed onto the mounting structure. As the surface mount device settles into the attach material, the movement of the surface mount device towards the mounting structure is limited by the filler material. Once settled, the distance between the surface mount device and the mounting structure is defined by the diameter of the filler material.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIG. 2 illustrates mounting a surface mount electronic device to a structure using an attach material with filler according to one embodiment of the present invention;

Figure 1:
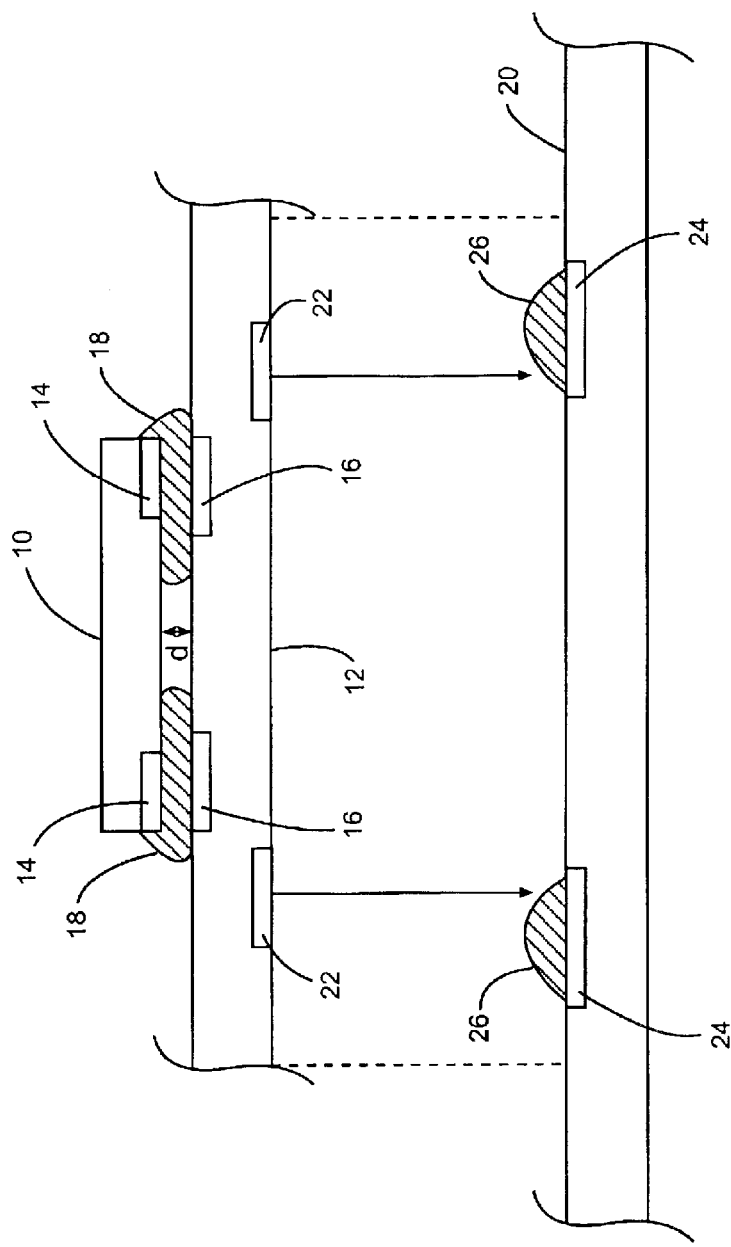
FIG. 1 illustrates the mounting of a surface mount device to a mounting structure using solder as is commonly known in the art.
Figure 4:
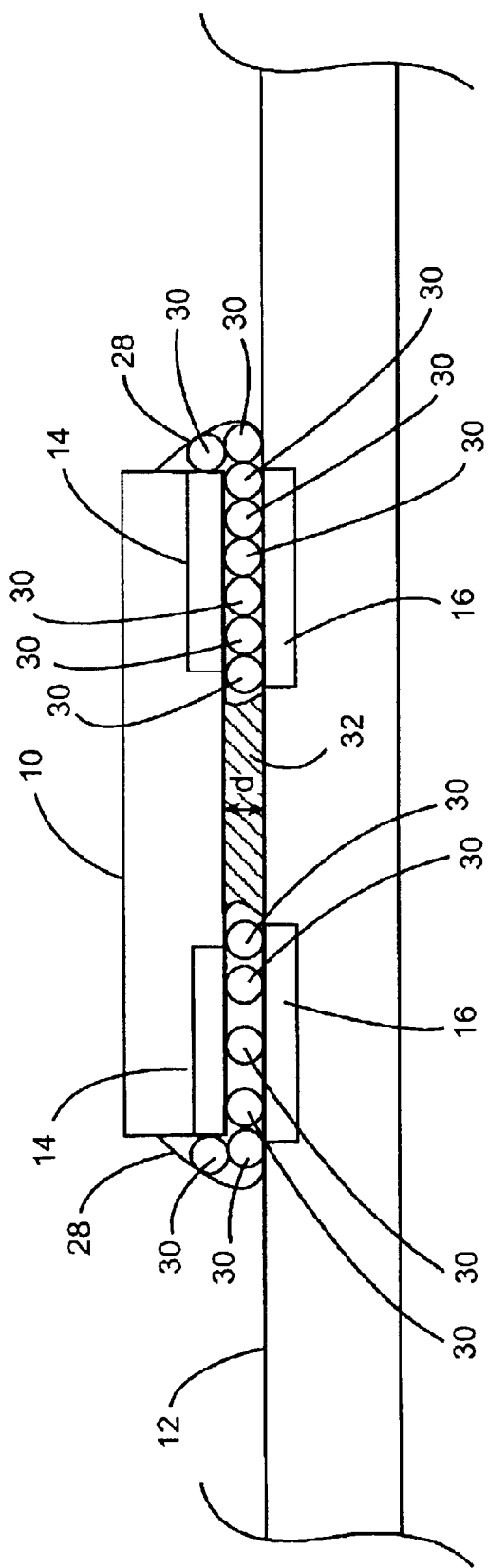

FIG. 3 illustrates a surface mount electronic device mounted to a structure with attach material having filler according to one embodiment of the present invention; and FIG. 4 illustrates a surface mount electronic device mounted to a structure using an attach material with filler wherein the area between the surface mount electronic device and the structure is filled with an underfill material according to one embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

FIG. 2 illustrates an electronic surface mount device (SMD) 10 prior to mounting to a mounting structure 12. For simplicity, only contact pads 14 and 16 of the surface mount device 10 and the structure 12, respectively, are illustrated. However, the surface mount device 10 and the mounting structure 12 may have any number of contact pads. Further, the contact pads 14 and 16 are conductive and have a melting point greater than temperatures reached during the mounting of the surface mount device 10 to the mounting structure 12. In addition, the surface mount device 10 may be any semiconductor device or passive component. The mounting structure 12 may be any structure to which it is desirable to mount the surface mount device 12 such as but not limited to a circuit board, a leadframe, or another electronic device.

The surface mount device 10 is attached to the structure 12 by electrically attaching the contact pads 14 of the surface mount device 10 to the contact pads 16 of the structure 12 using attach material 28 having filler 30. The attach material 28 may be any conductive material suitable for attachment of the surface mount device 10 to the mounting structure 12, such as but not limited to solder or conductive epoxy. The filter 30 may be any of a number of conductive or non-conductive materials having a melting point greater than a melting point of the attach material 28. These materials include but are not limited to silica, copper, aluminum oxide, tin, lead, gold, silver, indium, nylon, plastic, nickel, or carbon, and may be used individually or in combination. In addition, the filler 30 is preferably a relatively solid and granular shaped material having sufficient rigidity to support the surface mount device 12 in the presence of expected and/or unexpected external forces.

Mounting the surface mount device 10 to the structure 12 is achieved by placing the attach material 28 including the filler material 30 on the contact pads 14 of the surface mount device 10. Optionally, the attach material 28 including the filler material 30 may be placed on both the contact pads 14 of the surface mount device 10 and the contact pads 16 of the mounting structure 12. As another option, the attach material 28 including the filler material 30 may be placed only on the contact pads 16 of the mounting structure 12. The contact pads 14 of the surface mount device 10 are aligned with the contact pads 16 of the structure 12, and the surface mount device 10 is placed onto the mounting structure 12. As the surface mount device 10 settles into the attach material 28, the movement of the surface mount device 10 towards the structure 12 is limited by the filler material 30. Once settled, a distance between the surface mount device and the structure is defined by the diameter of the filler material 30.

FIG. 3 illustrates the surface mount device 10 attached to the mounting structure 12 via the contact pads 14 and 16 using the attach material 28. As illustrated, the filler 30, and more specifically the diameter of the filler 30, defines the distance d between the surface mount device 10 and the structure 12. The diameter of the filler 30 corresponds to the cross-sectional diameter of the filler 30, wherein the filler 30 may have any cross-sectional shape including but not limited to circular, square, rectangular, or polygonal. In one embodiment, the diameter of the filler 30 is in the range including 50 micrometers to 100 micrometers. However, it is important to note that the filler 30 can have any diameter, and the diameter of the filler 30 depends on the details of the particular design. Therefore, according to the present invention, the distance d between the surface mount device 10 and the structure 12 is controlled by the diameter of the filler 30 in the attach material 28.

The ability to control the distance d is advantageous for many reasons. As discussed previously, if the distance d is unpredictable, the contact pads 14 of the surface mount device 10 may become shorted. The attachment material 28 having the filler 30 controls the distance d such that the distance d is sufficient to prevent the shorting of the contact pads 14 caused by gravity and the placement of the surface mount device 10. Controlling the distance d may also be beneficial for many radio frequency applications by reducing interference and noise. Another advantage is that the controlled distance d allows soldering residue to be cleaned from beneath the surface mount device 10. In addition, the controlled distance d allows the area between the surface mount device 10 and the structure 12 to be accurately filled with underfill material, which will be described in detail below.

FIG. 4 illustrates another embodiment of the present invention in which the attach material 28 including the filler 30 may be used in combination with a non-conductive underfill material 32 to improve a moisture sensitivity level (MSL) performance of the surface mount device 10. Typically, solder (not shown) without filler 30 is used for mounting the surface mount device 10 to the structure 12 via the contact pads 14 and 16, thereby causing the distance d to be unpredictable and making it very difficult to encapsulate or insert the underfill material 32 between the surface mount device 10 and the structure 12. The difficultly in inserting the underfill material 32 may cause an opening in the underfill material 32 that creates an open path between the contact pads 14 of the surface mount device 10 and/or the contact pads 16 of the structure 12. The opening may allow moisture to accumulate between the surface mount device 10 and the structure 12. When the solder is reheated, the moisture turns to steam and forces its way out of the device causing delamination and solder reflow. Further, the solder may flow through the opening when reheated and may short the contact pads 14 of the surface mount device 10.

According to the present invention, the attach material 28 including the filler 30 controls the distance d between the surface mount device 10 and the structure 12. By controlling the distance d, the area between the surface mount device 10 and the structure 12 can be accurately filled with underfill material 32. The controlled distance d allows the underfill material 32 to be inserted such that there is no opening creating a path between the contact pads 14 of the surface mount device 10 and/or the contact pads 16 of the structure 12. Therefore, the contact pads 14 of the surface mount device 10 and/or the contact pads 16 of the structure 12 cannot be shorted during reflow.

The embodiment illustrated in FIG. 4 has an area defined by the surface mount device 10, the structure 12, and the attach material 28 is filled with the non-conductive underfill material 32. However, it is important to note that the underfill material 32 is optional and is not necessary to prevent the shorting of the contact pads 14 of the surface mount device 10.

Those skilled in the art will recognize improvements and modifications to the preferred embodiments of the present invention. All such improvements and modifications are considered within the scope of the concepts disclosed herein and the claims that follow.

What is claimed is:

1. A system comprising:

a mounting structure having first contact pads;

an electronic surface mount device having second contact pads;

conductive attach material including filler and electrically attaching each of the first contact pads to corresponding ones of the second contact pads; and the filler controlling a distance between the mounting structure and the electronic surface mount device.

2. The system of claim 1 wherein the conductive attach material is conductive epoxy.

3. The system of claim 1 wherein the conductive attach material is solder.

4. The system of claim 3 wherein the filler has a melting point greater than the melting point of the solder.

5. The system of claim 1 wherein the filler is a conductive material.

6. The system of claim 1 wherein the filler is a non-conductive material.

7. The system of claim 1 wherein the filler includes material selected from the group consisting of silica, copper, aluminum oxide, tin, gold, silver, indium, nylon, plastic, nickel and carbon.

8. The system of claim 1 wherein the filler is a granular material having sufficient rigidity to support the electronic surface mount device.

9. The system of claim 1 wherein the distance corresponds to a diameter of the filler.

10. The system of claim 1 further comprising a non-conductive underfill material filling an area defined by the mounting structure, the electronic surface mount device, and the attach material.

11. The system of claim 1 wherein the mounting structure is selected from the group consisting of a circuit board, a leadframe, and a second electronic device.

12. The system of claim 1 wherein the mounting structure further includes third contact pads and the system further comprises:

a second structure having fourth contact pads; and second attach material having filler and electrically attaching each of the third contact pads to corresponding ones of the fourth contact pads.

13. The system of claim 12 wherein the second structure is selected from the group consisting of a circuit board, a leadframe, and a second electronic device.

14. A system comprising:

a mounting structure having first contact pads;

an electronic surface mount device having second contact pads;

conductive attach material including filler and electrically attaching each of the first contact pads to corresponding ones of the second contact pads;

a non-conductive underfill material filling an area defined by the mounting structure, the electronic surface mount device, and the conductive attach material; and the filler controlling a distance between the mounting structure and the electronic surface mount device.

15. The system of claim 14 wherein the conductive attach material is conductive epoxy.

16. The system of claim 14 wherein the conductive attach material is solder.

17. The system of claim 16 wherein the filler has a melting point greater than the melting point of the solder.

18. The system of claim 14 wherein the filler is a conductive material.

19. The system of claim 14 wherein the filler is non-conductive material.

20. The system of claim 14 wherein the filler includes material selected from the group consisting of silica, copper, aluminum oxide, and tin.

21. The system of claim 14 wherein the filler is a granular material having sufficient rigidity to support the electronic surface mount device.

22. The system of claim 14 wherein the distance corresponds to a diameter of the filler.

23. The system of claim 14 wherein the mounting structure is selected from the group consisting of a circuit board, a leadframe, and a second electronic device.

24. An attach material comprising:

conductive attach material; and filler within the conductive attach material, wherein the filler is a granular material having sufficient rigidity to support an electronic surface mount device and is adapted to control a distance between a mounting structure and an electronic surface mount device electrically attached by the conductive attach material.

25. The attach material of claim 24 wherein the conductive attach material is conductive epoxy.

26. The attach material of claim 24 wherein the conductive attach material is solder.

27. The attach material of claim 26 wherein the filler has a melting point greater than the melting point of the solder.

28. The attach material of claim 24 wherein the filler is a conductive material.

29. The attach material of claim 24 wherein the filler is non-conductive material.

30. The attach material of claim 24 wherein the filler includes material selected from the group consisting of silica, copper, aluminum oxide, tin, gold, silver, indium, nylon, plastic, nickel, and carbon.

* * * * *